United States Patent

Christian et al.

(10) Patent No.: US 12,320,709 B1
(45) Date of Patent: Jun. 3, 2025

(54) EMBEDDABLE ULTRAHIGH TEMPERATURE SENSORS AND METHOD FOR MAKING

(71) Applicant: Leidos, Inc., Reston, VA (US)

(72) Inventors: Noah Christian, San Diego, CA (US); Marcie R. Black, Lincoln, MA (US)

(73) Assignee: Leidos, Inc., Reston, VA (US)

( * ) Notice: Subject to any disclaimer, the term of this patent is extended or adjusted under 35 U.S.C. 154(b) by 142 days.

(21) Appl. No.: 17/002,773

(22) Filed: Aug. 25, 2020

Related U.S. Application Data

(60) Provisional application No. 62/892,093, filed on Aug. 27, 2019.

(51) Int. Cl.
| | | |
|---|---|---|
| G01K 1/08 | (2021.01) | |
| G01K 7/01 | (2006.01) | |
| G01K 7/02 | (2021.01) | |
| H10N 10/851 | (2023.01) | |
| H10N 10/85 | (2023.01) | |
| H10N 10/855 | (2023.01) | |

(52) U.S. Cl.
CPC ............. *G01K 1/08* (2013.01); *G01K 7/015* (2013.01); *G01K 7/028* (2013.01); *H10N 10/8556* (2023.02); *H10N 10/85* (2023.02); *H10N 10/851* (2023.02); *H10N 10/855* (2023.02)

(58) Field of Classification Search
None
See application file for complete search history.

(56) References Cited

U.S. PATENT DOCUMENTS

| | | | |
|---|---|---|---|
| 3,832,668 A | 8/1974 | Berman | |
| 5,174,826 A | 12/1992 | Mannava et al. | |
| 5,786,023 A | 7/1998 | Maxwell et al. | |
| 6,080,241 A | 6/2000 | Li et al. | |
| 8,361,566 B2 | 1/2013 | Maxwell | |
| 8,669,164 B2 | 3/2014 | Maxwell et al. | |
| 10,167,555 B2 | 1/2019 | Maxwell et al. | |
| 10,683,574 B2 | 6/2020 | Maxwell et al. | |
| 2003/0089899 A1* | 5/2003 | Lieber | H01L 21/02653 257/E29.081 |
| 2006/0175601 A1* | 8/2006 | Lieber | H01L 29/1606 257/E29.081 |
| 2007/0228439 A1* | 10/2007 | Duan | H01L 27/12 977/762 |

(Continued)

FOREIGN PATENT DOCUMENTS

WO WO 2016/028693 2/2016

OTHER PUBLICATIONS

Lan, Xiaoqi et al., "A high performance all-organic thermoelectric fiber generator towards promising wearable electron", Composites Science and Technology 182, 107767. (Year: 2019).*

(Continued)

*Primary Examiner* — Tamir Ayad
(74) *Attorney, Agent, or Firm* — Dawn-Marie Bey; Bey & Cotropia PLLC

(57) ABSTRACT

A temperature sensor capable of taking contact method temperature measurements in extreme temperature environments includes a heterogenous ceramic fiber formed of two materials having different compositions, the heterogenous fiber including a junction between the first and second materials.

10 Claims, 10 Drawing Sheets

(56) References Cited

U.S. PATENT DOCUMENTS

2016/0237595 A1 8/2016 Maxwell et al.
2021/0376214 A1* 12/2021 Czubarow .............. B64D 41/00

OTHER PUBLICATIONS

Ren, Jiesheng et al., "Environmentally-friendly conductive cotton fabric as flexible strain sensor based on hot press reduced graphene oxide", Carbon 111, pp. 622-630. (Year: 2016).*

Xu, Xiaojie et al., "The Rise of Fiber Electronics", Angew. Chem. Int. Ed., 58, pp. 13643-13653. (Year: 2019).*

Ali, Azhar et al., "Nanowire-based thermoelectrics", Nanotechnology 28 (2017) 282001 (23pp) (Year: 2017).*

Xu, Zhuo et al., "Thermoelectric properties of silicon carbide nanowires with nitride dopants and vacancies", Physical Review B 84, 245451, 9 pages. (Year: 2011).*

El-Sheikh, S.M. et al., "Carbothermic Reaction Route for SiC Nanorods Synthesis Using Simple Precursors", Journal of Advanced Materials-Covina, 40(3), pp. 26-32. (Year: 2008).*

Casady, J.B. and Johnson, R.W. "Status of Silicon Carbide (SiC) as a Wide-Bandgap Semiconductor for High-Temperature Applications: A Review", Solid State Electronics, vol. 39, No. 10, pp. 1409-1422 (Year: 1996).*

Samsonov, G.V. and Kislyi, P.S., "Protective Tips for Thermocouples for the Continuous Control of Molten-Metal Temperatures," Apr. 1965. (Year: 1965).*

Wallenberger, F. T. & Nordine, P. C., "Strong, Pure and Uniform Carbon Fibers Obtained Directly from the Vapor Phase," *Science*, vol. 260, Issue 5104 (Apr. 2, 1993), pp. 66-68.

Vinson, Katherine, et al., "Dual-Wavelength in Situ Pyrometry During Additive Formation of Fibers by Laser-Induced Deposition," *JOM* 69.11 (2017): 2314-2319.

Maxwell, James L., et al. "Hyperbaric Laser Chemical Vapor Deposition of Carbon Fibers From the 1-Alkenes, 1-Alkynes, and Benzene," *Journal of the American Chemical Society* 128.13 (2006): 4405-4413.

Rife, Justin L., et al., "Structural and Mechanical Characterization of Carbon Fibers Grown by Laser Induced Chemical Vapor Deposition at Hyperbaric Pressures," Carbon 162 (2020): 95-105, Web.

Zhang, Song, et al. "High-Speed Preparation of <111>- and <110>-Oriented B-SiC Films by Laser Chemical Vapor Deposition," Ed. T Besmann, Journal of the American Ceramic Society 97.3 (2013): 952-958.

Wallenberger, Frederick T, and Paul C. Nordine, "Amorphous Silicon Nitride Fibers Grown From the Vapor Phase," Journal of Materials Research 9.3 (1994): 527-530, Web.

Banerjee, et al., "Fabrication of microcrystalline cubic silicon carbide/crystalline silicon heterojunction solar cell by hot wire chemical vapor deposition," Japanese Journal of Applied Physics 46, No. 1R (2007): 1.

Duty, et al., "Laser chemical vapour deposition: materials, modelling, and process control," International Materials Reviews 46, No. 6 (2001): 271-287; 1.

Neudeck, et al., "High-Temperature Electronics—A Role for Wide Bandgap Semiconductors?", Proc. IEEE, vol. 90, No. 6, Jun. 2002, DOI: 10.1109/JPROC.2002.1021571.

Maxwell, J. L., et al., "Preparation of superhard BxCy fibers by microvortex-flow hyperbaric laser chemical vapor deposition," Diam. Relat. Mater. 16 (2007), p1557ff.

* cited by examiner

| | | | | | | |
|---|---|---|---|---|---|---|
| Applications | High Temperature Cooling Loops | | Highest Temperature Traditional Thermocouple (TC) Sensor | Welding Fabrication Structural | Hypersonic Leading Edges; Abrasives; Wide Bandgap Semiconductors | Electrodes | Nozzles; Highest Melting Point Binary Mixture; Sensitive to oxidation at 430°C |
| Behavior | Melting Point of Sodium | Boiling Point of Sodium | Highest Practical TC Temperature | Melting Point of Stainless Steel | Sublimation Point of Silicon Carbide | Melting Point of Tungsten | Melting Point of Hafnium Carbide |
| | Na — Sodium | Na — Sodium | NiCr-NiAl — Type K Thermocouple | 308L — Stainless Steel | SiC — Silicon Carbide | W — Tungsten | HfC — Hafnium Carbide |
| Temperature | 98°C | 883°C | 1372°C | 1450°C | 2700°C | 3400°C | 3890°C |

Figure 1
Prior Art

EMBEDDABLE ULTRAHIGH TEMPERATURE SENSORS AND METHOD FOR MAKING

CROSS-REFERENCE TO RELATED APPLICATIONS

The present application claims benefit of priority to U.S. Provisional Patent Application No. 62/892,093, entitled "EMBEDDABLE ULTRAHIGH TEMPERATURE SENSORS AND METHOD FOR MAKING," filed Aug. 27, 2019, the entirety of which is incorporated herein by reference.

BACKGROUND

Field of the Embodiments

The embodiments are generally directed to sensors for facilitating contact temperature measurements in high and ultra-high temperature environments.

Description of Related Art

Sensors and electronics are not always compatible with operational temperatures of high temperature systems. FIG. 1 shows a list of materials that may operate at elevated temperatures relative to current electronics and sensors. The ability to produce integrated sensors directly into castings, billets, and other materials that can not only survive the extreme temperatures and pressures of manufacturing processes from the forge, but also perform measurements, including contact measurements, in these same environments would revolutionize process control for many extreme environments.

The fabrication of high-quality inorganic fibers such as SiC fibers, is challenging and expensive. Loading ferromagnetic materials into fibers at high concentrations is also difficult and leads to brittle fibers that cannot be shaped around tight contours. Lighter, thinner, and more flexible magnetic radar absorbing materials (MAGRAM) are needed for many DoD and IC applications. Low-cost, conductive inorganic fibers are also needed for many composite applications, e.g. for computer cases, conduits, antennas, and wind turbines. Similarly, Rare-Earth-doped optical fibers are difficult to fabricate and expensive, but underlie the future of data transmission, computing, and industrial laser sources.

Accordingly, there remains a need in the art for sensors, including temperature sensors, which are capable of taking contact method temperature measurements in extreme temperature environments.

SUMMARY OF THE EMBODIMENTS

In a first exemplary embodiment, a ceramic temperature sensor includes: a heterogenous fiber formed of two materials having different compositions, the heterogenous fiber including a junction between the first and second materials; wherein at least one of the first and second materials is silicon carbide (SiC); and further wherein the ceramic temperature sensor facilitates contact measurement of temperatures in excess of 600 degrees Celsius (° C.).

In a second exemplary embodiment, ceramic temperature sensor includes: a heterogenous fiber formed of two materials having different compositions, the heterogenous fiber including a junction between the first and second materials, wherein the junction forms an angle in the fiber between the two materials; wherein the ceramic temperature sensor facilitates contact measurement of temperatures in excess of 600 degrees Celsius (° C.).

In a third exemplary embodiment, ceramic device operable to facilitate contact temperature measurements in multiple modes dependent upon the temperature, includes: a heterogenous fiber including a p-n junction formed therein; wherein the p-n junction operates as a diode in a first mode to facilitate measurement of temperatures less than 600 degrees Celsius (° C.); and further wherein the ceramic device operates as a thermocouple to facilitate measurement of temperatures in excess of 600 degrees Celsius (° C.).

BRIEF DESCRIPTION OF FIGURES

FIG. 1 shows a comparison of physical properties of various materials at high temperature and their typical applications as is known in the existing art;

DETAILED DESCRIPTION

As shown in FIG. 1, the melting point and boiling point of sodium is shown at the low end, as a thermal cycle of this material can perform cooling in theory from about 100° C. to 900° C. Just above this is the typical Type-K thermocouple, capable of measurement up to about 1350° C., but typically not used above 1100° C. or so. Stainless steel melts at 1450° C. Temperature monitoring for melting metals is typically done by measurement of visible or infrared emission. Above the melting point of stainless steel, materials having higher sublimation (silicon carbide) and melting (tungsten, hafnium carbide) temperatures are the highly refractory metals and carbides. Silicon carbide enables the fabrication of high temperature electronics. It is also a semiconducting material that does not melt, but has a very high sublimation point, i.e., 2700° C. Incorporating silicon carbide into high temperature electronics is difficult, however, due to the lack of other high temperature conductors and insulators for appropriate fabrication and packaging of integrated electronics.

An ultrahigh temperature sensor that can operate in the temperature limit of SiC, or even higher, would be a significant improvement to the current state-of-the-art for temperature measurement. Thermocouples are nearly ubiquitous in areas where process control on systems is required, though manufacturing fully integrated systems with thermocouples can prove difficult. Thermocouples can be physically welded above their melting point or bonded at lower temperatures (<1200° C.), but manufacturing is problematic for temperatures above this range.

Because SiC is a wide bandgap semiconductor that is capable of p- or n-doping, diodes can be formed by joining the p- and n-junctions together. The bandgap of SiC is about 3 eV and varies based on its crystal structure. The wider bandgap means higher temperature than silicon before the Boltzmann distribution brings electrons into the conduction band. For Si this is 150° C., and for SiC this is above 600° C. An initial application is a high-temperature diode/thermocouple composed of n- and p-doped silicon carbide (SiC). SiN sensors are also contemplated and within the scope of the embodiments herein.

Figure 2A:
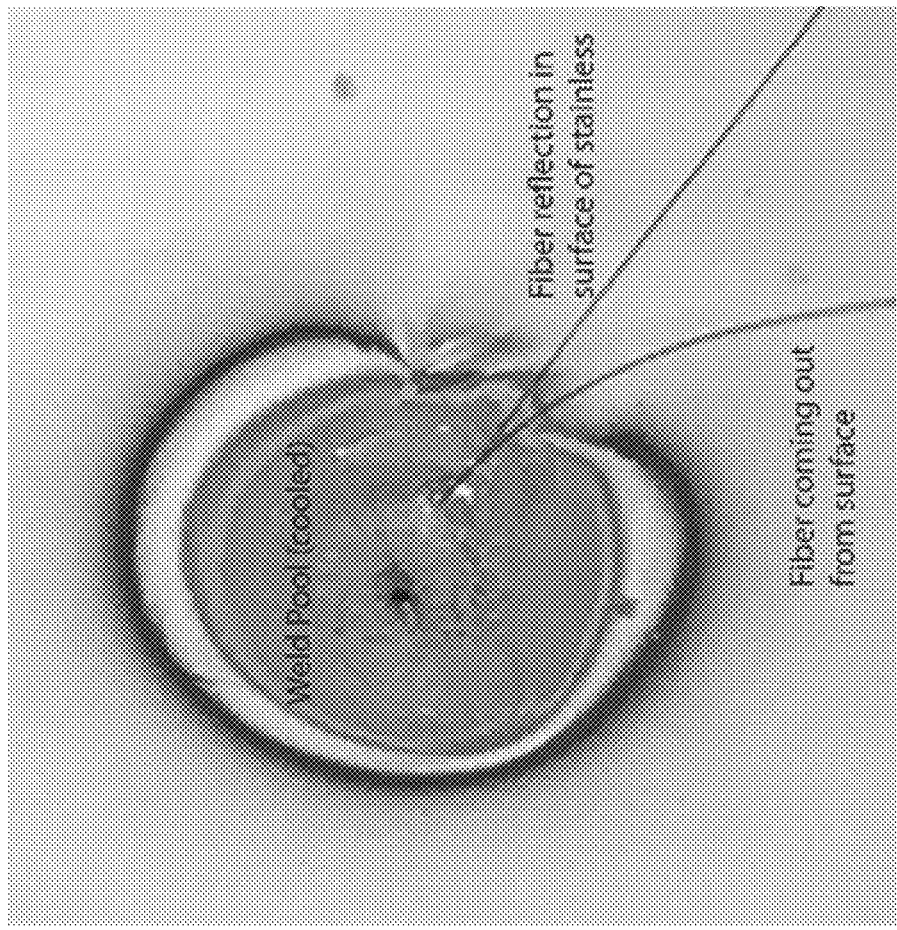
FIGS. 2a-2c shows representative SiC fiber configurations and incorporations in accordance with the embodiments contemplated herein.
Figure 2B:
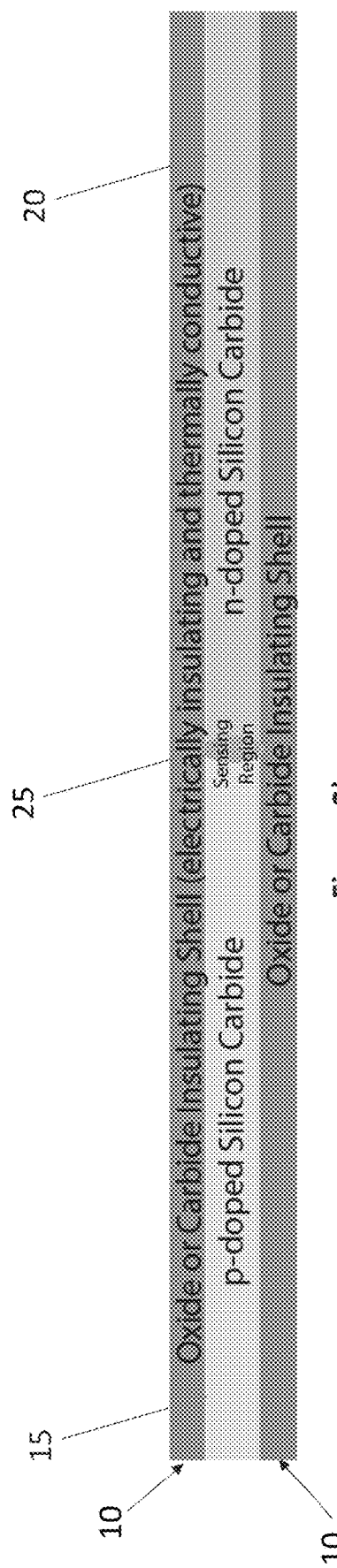

The ability to incorporate SiC into molten metals in accordance with the embodiments described herein is shown in FIG. 2a. A silicon carbide (SiC) fiber was inserted (embedded) into a molten weld pool of stainless steel. Such a structure can have an electrically insulating ceramic shell to isolate the structure (See FIG. 2b). A proposed architecture of an embeddable, high-temperature sensor is shown in FIG. 2b. The proposed all-ceramic fiber 5 architecture includes an oxide or carbide insulating shell 10 which is electrically insulating and thermally conductive; a p-doped silicon carbide portion 15, a n-doped silicon carbide portion 20 with sensing region 25 at the p-n junction thereof.

The heterostructure of this all-ceramic fiber can act as a diode at temperatures below approximately 600° C. And at temperatures above approximately 600° C., the conduction bands are suitably populated to overcome the junction barrier and turn the diode into a conductor. Because of the dissimilar materials, i.e., materials having different compositions, the fiber will act as a thermocouple sensor. As temperature increases, the diode shows increasing leakage as this band is populated. This leakage current provides one measure of temperature in a device. The all-ceramic structure of the sensor mean it can easily survive molten metal (<1500° C.), and is able to operate at temperatures well above that. At lower temperatures, it can be fully integrated into the solid metal structure and function as a diode-based temperature sensor.

Figure 2C:
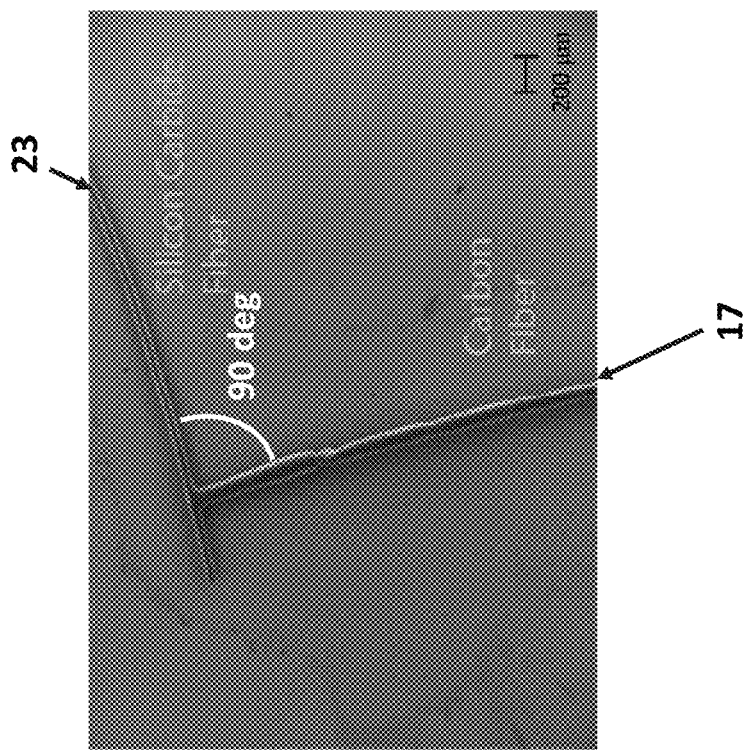

Additional fibers can be joined in arbitrary shapes and directions, as exemplified in FIG. 2c, which is an electron micrograph of carbon fiber 17 grown from a SiC fiber 23 via HP-LCVD as described herein. The junction forms an approximately 90 degree angle. Multiple shapes can be manufactured, as well as multiple materials joined, using HP-LCVD. The basic components can be expanded to more complex devices such as transistors and other control circuitry.

In a particular exemplary embodiment, a process for forming a SiC—C ceramic fiber includes placing a silicon carbide fiber into a reaction chamber. Reaction chambers are prevalent in the art and one skilled in the art would be familiar with available types of reaction chambers. By way of example only U.S. Pat. Nos. 6,080,241 and 5,174,826 disclose reaction chambers which may form the basis for a particular chamber used in the present embodiments. In the present embodiment, the silicon carbide fiber has a diameter of 50 micrometers, but one skilled in the art recognizes that fiber diameter is a variable and may be selected in accordance with the final requirements for the resulting sensor. The chamber is pumped out using a turbo pump. The pressure reached below 10-4 Torr. Hexane is introduced into the chamber and the pressure rises to 200 Torr. In this exemplary embodiment, a 2.78 um laser with a power of around 2 Watts is focused onto the silicon carbide fiber inside the chamber using appropriate optics including a set of lenses and mirrors.

As the silicon carbide absorbs the laser light, it locally heats up and the hexane decomposes onto the silicon carbide fiber depositing carbon. The focus of the laser is slowly moved back away from the silicon carbide wire as a carbon fiber begins to grow into the direction of the laser. The laser focus is adjusted until the desired length of the wire is reached. Fibers grown in accordance with this particular set up were approximately 100 μm in diameter. In alternative set-ups, diameters of between 2 μm and 30 μm may be achieved depending on variables including the focus point width, the laser power, ambient temperature, and the thermal conductance of the wire.

The second fiber can be grown at any angle from the original fiber. For example, the laser can be focused right on the tip of the first fiber and be incident in the direction of the wire's axis. This will result in a single fiber with a junction of two different compositions. The fibers can be grown at a shallow angle (or approximately 0 angle) from each other as shown in FIG. 2c or at right angles from each other as shown in FIG. 2b and with different sections of the fibers composed of different materials. For example, in FIG. 2b, the structure is SiC—C, wherein the C fiber was grown from the SiC fiber. The junction can also be grown so that one material encapsulates the other material as shown in FIG. 2c. P and n-type SiC can be grown by introducing precursors that add dopants or by doping the fiber after growth. Nitrogen acts as an n-type dopant in SiC and can be added by adding nitrogen or ammonia to the precursor. Aluminum acts as a p-type dopant in SiC and can be added by adding TMAI (Trimethylaluminum) to the precursor mix. Other precursor materials might include HMDS (hexamethyldisilazane) or TMS (Tetramethylsilane).

Different lasers can be used to catalyze the growth of SiC, SiN or C fibers. For example: Yttrium-Aluminum-Garnet (YAG) (e.g., Nd—Y AG, 532 nm green laser), carbon dioxide (CO2), and Yttrium fiber lasers. In addition, the precursors used to make the carbon and/or the silicon carbide and/or silicon nitride fibers can be varied and may include methane, silane/ethylene, hexane, ethanol/tetraethylorthosilicate (TEOS), ferrocene, TMS, Hexamethyldisilane (HMDS), silane/ammonia. Substrates may include, but are not limited to: carbon (e.g., amorphous), carbonized cardboard/paper, Si. One skilled in the art recognizes that the power, temperature, laser energy/source, substrate and precursors all will impact the type of material that is being deposited.

The manufacturing approach described herein, hyperbaric laser-directed chemical vapor deposition, or HP-LCVD, enables the fabrication of such sensors. Hyperbaric Laser-directed Chemical Vapor Deposition (HP-LCVD) is a process that enables rapid growth of complex structures, fibers, arrays, shapes, and nets with unique mechanical, optical, and electrical properties. The process uses high pressure to greatly increase the manufacturing speed when compared to other chemical vapor deposition (CVD) processes. Fiber growth rates can be as fast as 10 cm/sec and can include metals, nonmetals, ceramics, and composite materials. The process described herein can be used to manufacture all of the materials in FIG. 1, and due to the high partial pressure of starting materials, is able to do so without the susceptibility to contamination that standard CVD exhibits.

Figure 3A:
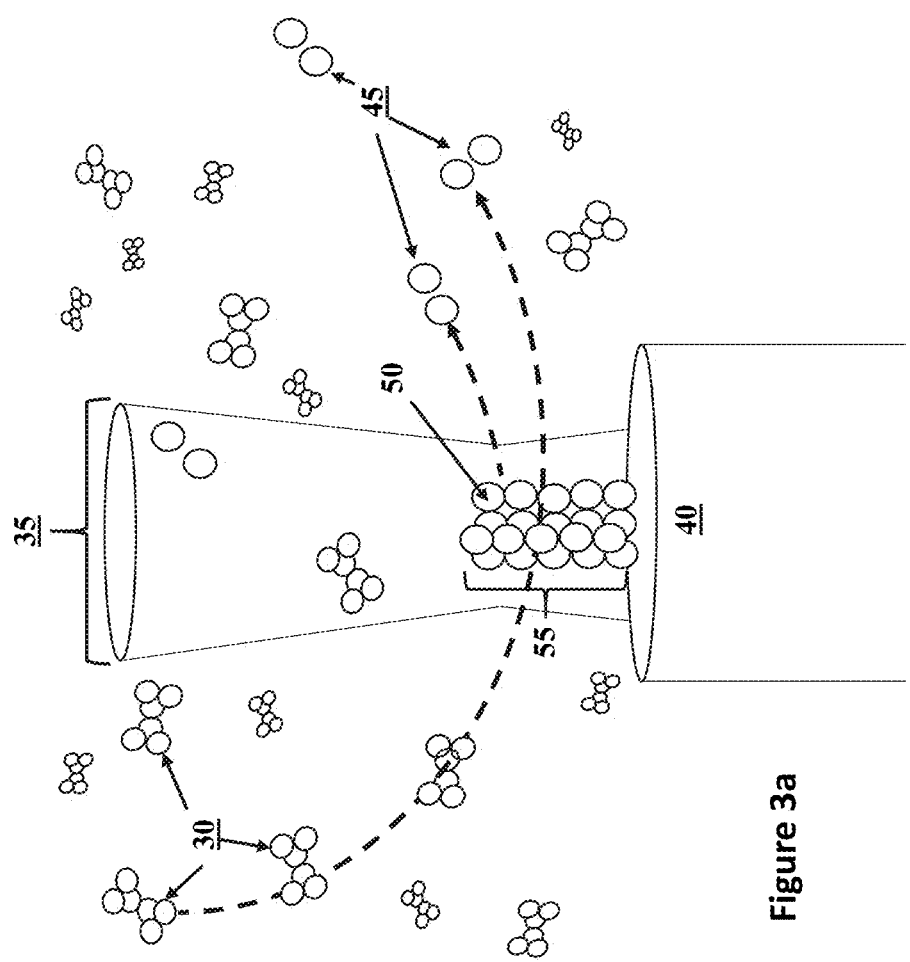
FIGS. 3a-3c shows exemplary HP-LCVD operation schematic (FIG. 3a), an Al—Si fiber grown in accordance with the HP-LCVD process (FIG. 3b), and a phase diagram showing silicon solubility in aluminum (FIG. 3c)

HP-LCVD is an important emerging additive manufacturing process that is extremely flexible in both geometry and materials. In HP-LCVD, a focused laser beam thermally induces the decomposition of a precursor, leaving behind a solid deposit which can form a fiber in three-dimensions. As shown in FIG. 3a chemical precursors 30 are decomposed at laser-heated 35 reaction zones. The precursors 30 diffuse to the reaction zone, where they adsorb on the substrate 40. The precursor decomposes leaving "adatoms" 50. Byproducts 45 of the reaction desorb from the surface and return to the gas phase. As more adatoms are deposited, a fiber 55 grows in the direction of the laser beam(s) 35. By reorienting and scanning the laser beams in three-dimensions, complex structures can be additively manufactured. A description of certain exemplary HP-LCVD processes and systems are described in U.S. Pat. Nos. 10,683,574, 10,167,555, 8,669,164, 8,361,566, and 5,786,023 which are incorporated herein by reference in their entireties.

Figure 3C:
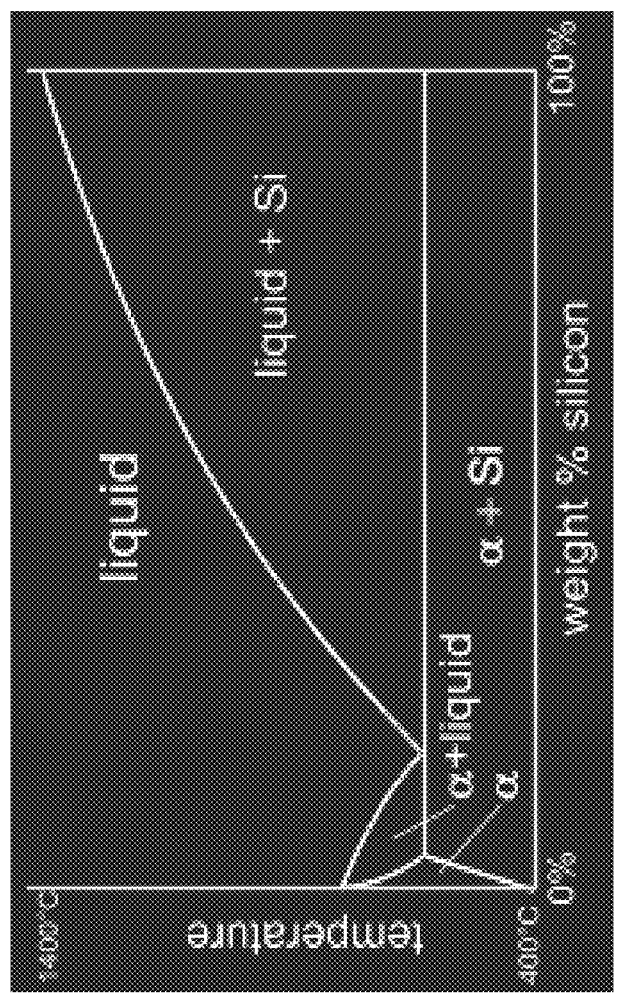
Figure 3B:
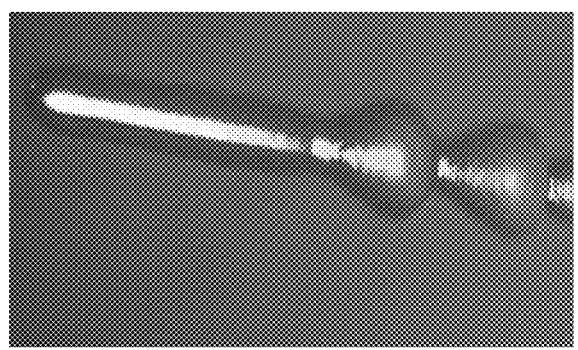

By way of particular example, FIG. 3b illustrates a 40 micron diameter Al—Si alloy fiber grown from two chemical precursors simultaneously, one depositing aluminum and another depositing silicon, using the HP-LCVD process of FIG. 3a. The equilibrium Aluminum-Silicon phase diagram of FIG. 3c shows that silicon has very little solubility in aluminum that typically leads to phase separation.

For concept verification regarding SiC temperature sensing, a commercial off-the-shelf (COTS) SiC Schottky diode (CAP3SLT33 SiC Schottky diode from GeneSiC) (hereafter "test sensor") was tested to assess the ability to measure temperatures above the commercial temperature range (175° C.). Current/voltage (IV) curves were measured at a range of temperatures from slightly above ambient to 350° C. Representative calibration curves were made using 'constant current' and 'constant voltage' determination. Above some temperature, the device acts as a thermocouple and not a diode. As temperature increases, the diode shows increasing leakage as this band is populated. This leakage current provides one measure of temperature in a device.

Figure 4:
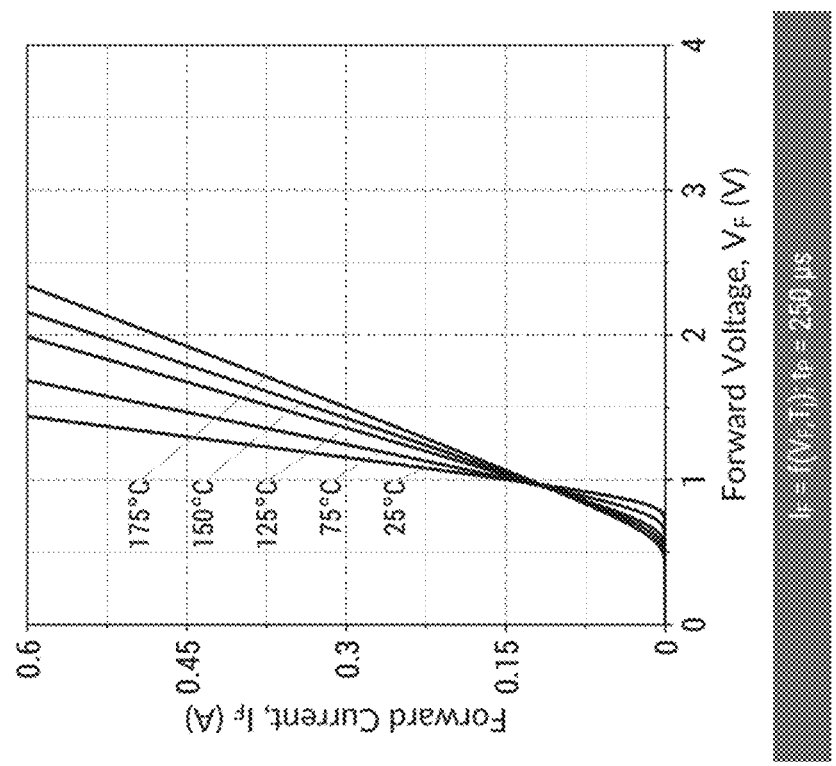
FIG. 4 is prior art COTS manufacturer published IV data for comparison with proof of concept experiment described herein.
Figure 5:
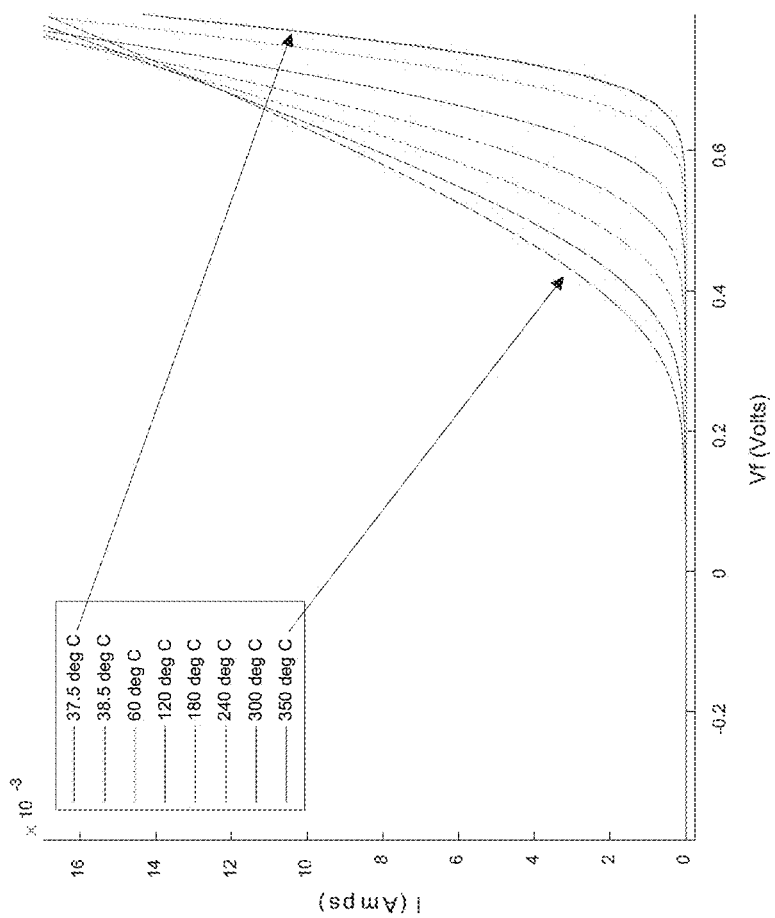
FIG. 5 is resulting IV data for a test sensor in accordance with the proof of concept experiment described herein.
Figure 6:
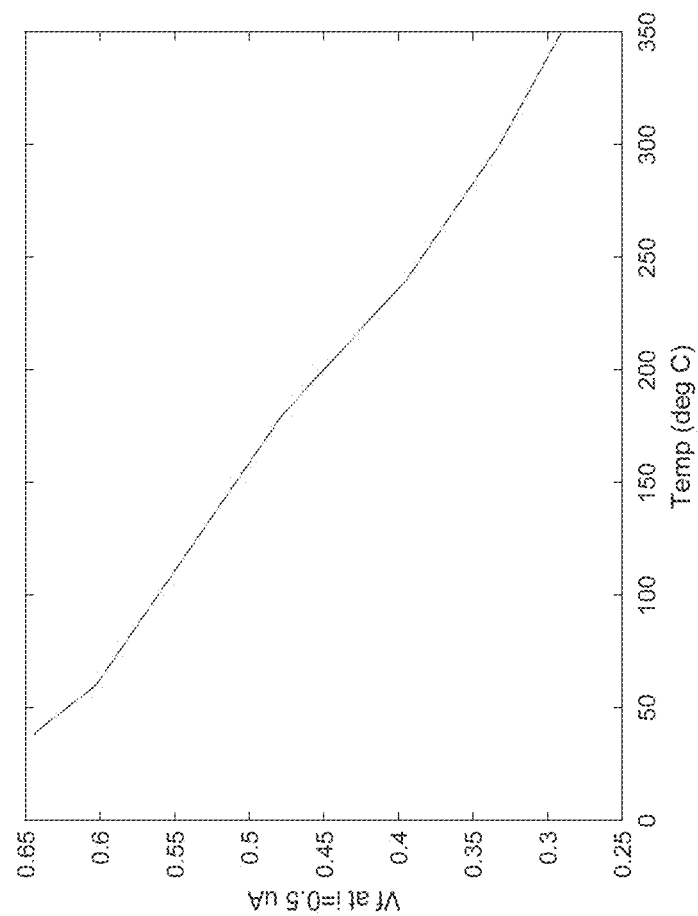
FIG. 6 is resulting forward voltage across temperature data in accordance with the proof of concept experiment described herein.

The test sensor has a rating of 175° C. maximum temperature. Beyond the maximum high temperature, case degradation, wire bond failure, and device failure are expected, but no degradation in the device was observed during testing up to 350° C. The manufacturer publishes IV data up to 0.6 A at over 1V forward voltage with pulsed waveforms (FIG. 4), however for the present embodiments, the interest is in using the diode as a sensor and not as a power device. Accordingly, for the proof of concept experiments, forward voltage was limited to 0.8V and current to 100 mA. The voltage was note pulsed during the IV curve measurement as the environmental temperature was expected to be much higher than the junction temperature rise from constant DC voltage at these low voltage levels. The resulting IV data for test sensor (FIG. 5) mimics the data the manufacturer published (FIG. 4). High temperature measurement is limited if one uses constant current and measures the voltage; at higher temperatures where the 'voltage knee' gets 'softer' on the IV curve, the curves bunch together. In order to avoid this, low currents are necessary to keep the voltage measurements more consistent. Accordingly, we chose 0.5 microamps as a representative current. Forward voltages across this temperature are shown in FIG. 6.

Figure 7:
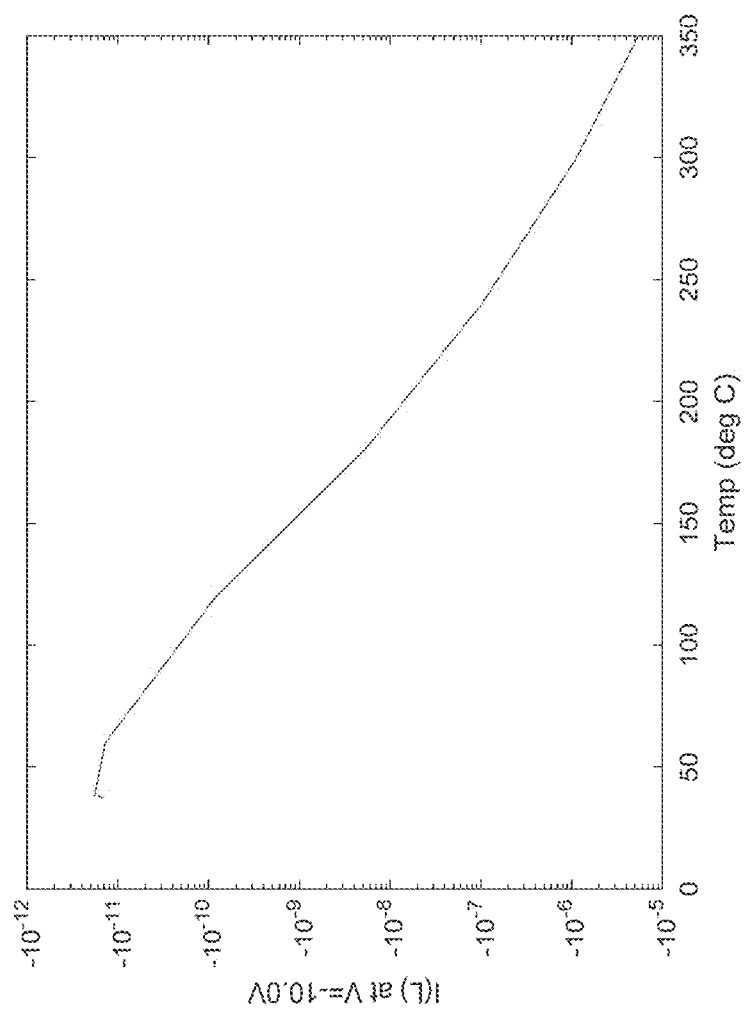
FIG. 7 is resulting plot showing leakage current which has a log relationship to temperature, in accordance with the proof of concept experiment described herein.

Under constant reverse voltage, the diode leakage current can be used to determine temperature. Here, we chose an arbitrary voltage of −10.0V, though almost any voltage could be chosen up to close to 3300V on this device. The leakage current has a log relationship to temperature, and thus we plot this data on a semilog (log Y) graph (FIG. 7). The data again are linear (to this log relationship) and this is expected to work well for temperature measurement at higher temperatures (well in excess of 350° C.). We would expect this to be in the milliamp range at approximately 550° C. (assuming the COTS device could survive that temperature). At low temperatures (near room temperature), the leakage currents are low, in the low nA to pA range. This type of measurement is more difficult to make (i.e. it requires more integration and settling time and is prone to noise) compared to the previous forward voltage mode at lower temperatures. Both measurement modes could be used, the constant current method at lower temperatures and the constant voltage method at higher temperatures.

A third measurement mode would be employed above around 550° C. At these temperatures, the test sensor is no longer viable and the exemplary sensors described herein are employed. The present sensors avoid the use of any metals, including on interconnects, and instead of using a Schottky barrier device like the test sensor, an all-ceramic is used.

The sensors prepared in accordance with the embodiments herein may be used in a broad range of applications from the ionizing fields of space to the ultrahigh temperatures experienced in the intake cowl of a hypersonic vehicle, to the less extreme environments of turbines, internal combustion engines, and other structures. Incorporating temperature sensors capable of measurement in extreme environments without requiring optical/spectroscopic readout will enable pervasive monitoring of materials such as hypersonic leading edges, composite carbon-carbon brakes, and compression and exhaust temperatures and pressures in turbines. This monitoring can cover all phases of the product lifecycle, including materials preparation, fabrication, test, and deployment, and facilitate predictive maintenance and failure analysis of structural and functional components.

Because we are able to manufacture a wide variety of ceramics and composites, other measurement modalities such as pressure, strain, electric field measurement, and magnetic field measurement are possible. The measurement of pressure and strain could be used to ensure materials are not subjected to their yield strength in operation, yet are operating near their most efficient operating points. Minimizing wall thicknesses in the engine cylinder is one way to reduce weight, provided it does not lead to failure. An integral strain sensor could ensure this, while a strain gauge could be incorporated integral to each piston shaft, monitoring the torque and horsepower contribution of that cylinder to the overall output of the engine.

Measuring electric fields would help in application such as leading edges of hypersonic vehicles and in space applications. Electric fields lead to plasma generation, which can lower the lifetime of composite materials. Monitoring this can help in lifetime monitoring of the composite material, as well as add predictive modelling to failure modes of composites. Integral magnetic field sensors could be useful for both navigation as well as monitoring structural integrity in hulls and to establish whether a hull requires degaussing. Stray magnetic fields can affect metal welding, and having a component with an integral magnetic sensor in each panel or part could ensure that a hull is manufactured with the best possible structural characteristics.

The following documents provide additional support for the descriptions of the embodiments herein as they include examples of alternative materials and components that would have been known to one skilled in the art. The documents are incorporated herein by reference and include: U.S. Pat. No. 3,832,668; Banerjee, et al., "Fabrication of microcrystalline cubic silicon carbide/crystalline silicon heterojunction solar cell by hot wire chemical vapor deposition." Japanese journal of applied physics 46, no. 1R (2007):

1; Duty, et al., "Laser chemical vapour deposition: materials, modelling, and process control." International Materials Reviews 46, no. 6 (2001): 271-287; 1; Neudeck, et al., "High-Temperature Electronics-A Role for Wide Bandgap Semiconductors?", Proc. IEEE, 2002, DOI: 10.1109/ JPROC.2002.1021571; Maxwell, J. L, et al., "Preparation of superhard BxCy fibers by microvortex-flow hyperbaric laser chemical vapor deposition," Diam. Relat. Mater. 16 (2007), p1557ff; Wallenberger, F. T. "Strong, Pure and Uniform Carbon Fibers Obtained Directly from the Vapor Phase." Science, 260 (1993) 66-8; Vinson, Katherine et al. "Dual-Wavelength in Situ Pyrometry During Additive Formation of Fibers by Laser-Induced Deposition." JOM 69.11 (2017): 2314-2319; Maxwell, James L et al. "Hyperbaric Laser Chemical Vapor Deposition of Carbon Fibers From the 1-Alkenes, 1-Alkynes, and Benzene." Journal of the American Chemical Society 128.13 (2006): 4405-4413; Rife, Justin L et al. "Structural and Mechanical Characterization of Carbon Fibers Grown by Laser Induced Chemical Vapor Deposition at Hyperbaric Pressures." Carbon 162 (2020): 95-105; Zhang, Song et al. "High-Speed Preparation of <111>- and <110>-Oriented B—SiC Films by Laser Chemical Vapor Deposition." Ed. T Besmann. Journal of the American Ceramic Society 97.3 (2013): 952-958; and Wallenberger, Frederick T et al., "Amorphous Silicon Nitride Fibers Grown From the Vapor Phase." Journal of Materials Research 9.3 (1994): 527-530.

The invention claimed is:

1. A metal component including a ceramic thermocouple temperature sensor embedded therein;
   wherein the metal component comprises a molten metal, and the ceramic thermocouple temperature sensor is embedded in the molten metal;
   wherein the ceramic thermocouple temperature sensor comprises a single heterogenous fiber having a diameter in a range of 2 um to 20 um formed of two materials having different compositions, the heterogenous fiber including a junction between the two materials; wherein the ceramic thermocouple temperature sensor further comprises a ceramic shell formed around the heterogeneous fiber, the ceramic shell comprising a third material having a different composition from the two materials;
      wherein a first of the two materials is an n-type silicon carbide (SiC) and a second of the two materials is a p-type silicon carbide (SiC); and
      wherein the ceramic thermocouple temperature sensor facilitates contact measurement of temperatures in excess of 1500 degrees Celsius (° C.).

2. The metal component of claim 1, wherein the junction forms an angle in the fiber between the two materials.

3. The metal component of claim 1, wherein the third material is selected from a group consisting of an oxide and a carbide.

4. The metal component of claim 1, wherein the molten metal is stainless steel.

5. A metal component including a ceramic thermocouple temperature sensor embedded therein;
   wherein the metal component comprises a molten metal, and the ceramic thermocouple temperature sensor is embedded in the molten metal;
   wherein the ceramic thermocouple temperature sensor comprises a single heterogenous fiber having a diameter in a range of 2 um to 20 um formed of two materials having different compositions, the heterogenous fiber including a junction between the two materials, wherein the junction forms an angle in the fiber between the two materials; wherein the ceramic thermocouple temperature sensor further comprises a ceramic shell formed around the heterogeneous fiber, the ceramic shell comprising a third material having a different composition from the two materials;
   wherein a first of the two materials is a n-type silicon carbide (SiC) and a second of the two materials is a p-type silicon carbide (SiC); and
   wherein the ceramic thermocouple temperature sensor facilitates contact measurement of temperatures in excess of 1500 degrees Celsius (° C.).

6. The metal component of claim 5, wherein the third material is selected from a group consisting of an oxide and a carbide.

7. The metal component of claim 5, wherein the molten metal is stainless steel.

8. A metal component including a ceramic device embedded therein operable to facilitate contact temperature measurements in multiple modes dependent upon a temperature range, the component comprising
   molten metal; wherein the ceramic device comprises
   a single heterogenous fiber having a diameter in a range of 2 um to 20 um including a p-n junction formed in silicon carbide (SiC), and a ceramic shell formed around the heterogeneous fiber, wherein the heterogeneous fiber comprises inorganic materials;
   wherein the p-n junction operates as a diode in a first mode to facilitate measurement of temperatures in a range less than 600 degrees Celsius (° C.); and
   further wherein the ceramic device operates as a thermocouple to facilitate measurement of temperatures in a range in excess of 1500 degrees Celsius (° C.).

9. The metal component of claim 8, wherein the ceramic shell is selected from a group consisting of an oxide and a carbide.

10. The metal component of claim 8, wherein the molten metal is stainless steel.

* * * * *